(12) United States Patent
Berkcan

(10) Patent No.: US 6,750,644 B1
(45) Date of Patent: Jun. 15, 2004

(54) MAGNETIC FIELD SENSOR AND METHOD FOR CALIBRATING THE SAME

(75) Inventor: Ertugrul Berkcan, Niskayuna, NY (US)

(73) Assignee: General Electric Company, Schenectady, NY (US)

( * ) Notice: Subject to any disclaimer, the term of this patent is extended or adjusted under 35 U.S.C. 154(b) by 542 days.

(21) Appl. No.: 09/655,590

(22) Filed: Sep. 6, 2000

(51) Int. Cl.[7] .......................... G01R 33/00; G01R 1/14
(52) U.S. Cl. .................. 324/117 R; 324/117 H; 324/127; 324/529
(58) Field of Search ...................... 324/96, 117 R, 324/127, 529, 117 H

(56) References Cited

U.S. PATENT DOCUMENTS

| | | | | |
|---|---|---|---|---|
| 4,823,075 A | * | 4/1989 | Alley | 324/117 H |
| 5,260,661 A | * | 11/1993 | Vail III | 324/339 |
| 5,337,013 A | * | 8/1994 | Langer et al. | 324/537 |
| 5,438,257 A | * | 8/1995 | Berkcan | 324/117 R |
| 5,453,681 A | * | 9/1995 | Berkcan et al. | 324/127 |
| 5,570,034 A | * | 10/1996 | Needham et al. | 324/763 |
| 6,118,279 A | * | 9/2000 | Field et al. | 324/529 |
| 6,173,501 B1 | * | 1/2001 | Blank et al. | 33/356 |
| 6,323,653 B1 | * | 11/2001 | Field et al. | 324/529 |

* cited by examiner

*Primary Examiner*—N. Le
*Assistant Examiner*—Wasseem H. Hamdan
(74) *Attorney, Agent, or Firm*—Pierce Atwood

(57) ABSTRACT

A magnetic field sensor is provided with a device for producing an output signal that is a function of a magnetic field to be sensed. A calibration coil is arranged so as to change the magnetic field when energized, and a switch for selectively energizing the calibration coil is included. Calibration of the magnetic field sensor is accomplished by operating the switch to cause a known current to flow through the calibration coil, measuring the resultant change in the magnetic field, and calculating a sensitivity for the magnetic field sensor from the measured change in the magnetic field and the known current.

29 Claims, 6 Drawing Sheets

US 6,750,644 B1

MAGNETIC FIELD SENSOR AND METHOD FOR CALIBRATING THE SAME

BACKGROUND OF THE INVENTION

1. Field of the Invention

This invention relates generally to magnetic field sensors and more particularly to auto-calibrated magnetic field sensors used as current sensors.

2. Background Art

Magnetic field sensors of all kinds are used in many applications. One type of magnetic field sensor is the current sensor, which is widely used in circuit breaker and metering applications. For instance, many circuit breakers use at least one current transformer to sense the current level in the electrical distribution circuit being protected. The current transformer includes an annular core that encircles the line conductor of the distribution circuit and has a multi-turn winding wound thereon. The current flowing through the line conductor generates a magnetic field that produces flux in the transformer's core, resulting in an output from the multi-turn winding that is indicative of the current level. If the current exceeds a predetermined level, then the circuit breaker mechanism is tripped. The sensor must be calibrated properly so that the output from the multi-turn winding accurately represents the current in the line conductor.

All such magnetic field sensors are affected by temperature and other environmental factors that can adversely impact the performance of the sensor. Over time, these adverse effects that will affect the calibration of the sensor. The loss of calibration of the sensor will reduce its accuracy.

Accordingly, it would be desirable to have a magnetic field sensor that can calibrate itself and remove the affects of temperature and other environmental factors on its sensitivity.

BRIEF SUMMARY OF THE INVENTION

The above-mentioned need is met by the present invention which provides a magnetic field sensor having a means for producing an output signal that is a function of a magnetic field to be sensed. A calibration coil is arranged so as to change the magnetic field when energized, and a means for selectively energizing the calibration coil is included. Calibration of the magnetic field sensor is accomplished by causing a known current to flow through the calibration coil, measuring the resultant change in the magnetic field, and calculating a sensitivity for the magnetic field sensor from the measured change in the magnetic field and the known current.

The present invention and its advantages over the prior art will become apparent upon reading the following detailed description and the appended claims with reference to the accompanying drawings.

BRIEF DESCRIPTION OF THE DRAWINGS

The subject matter that is regarded as the invention is particularly pointed out and distinctly claimed in the concluding part of the specification. The invention, however, may be best understood by reference to the following description taken in conjunction with the accompanying drawing figures in which:

DETAILED DESCRIPTION OF THE INVENTION

Figure 1:
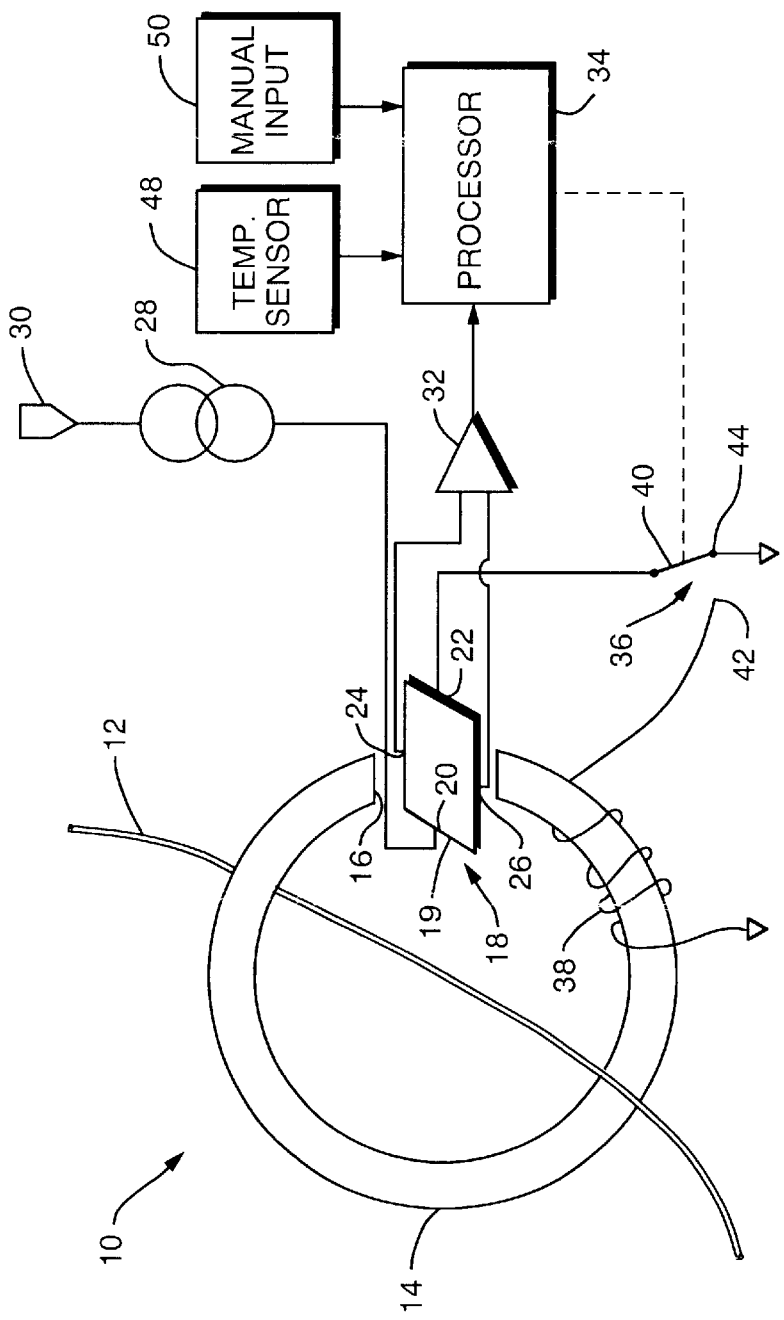
FIG. 1 is a schematic view of a current sensor set for normal operation.
Figure 2:
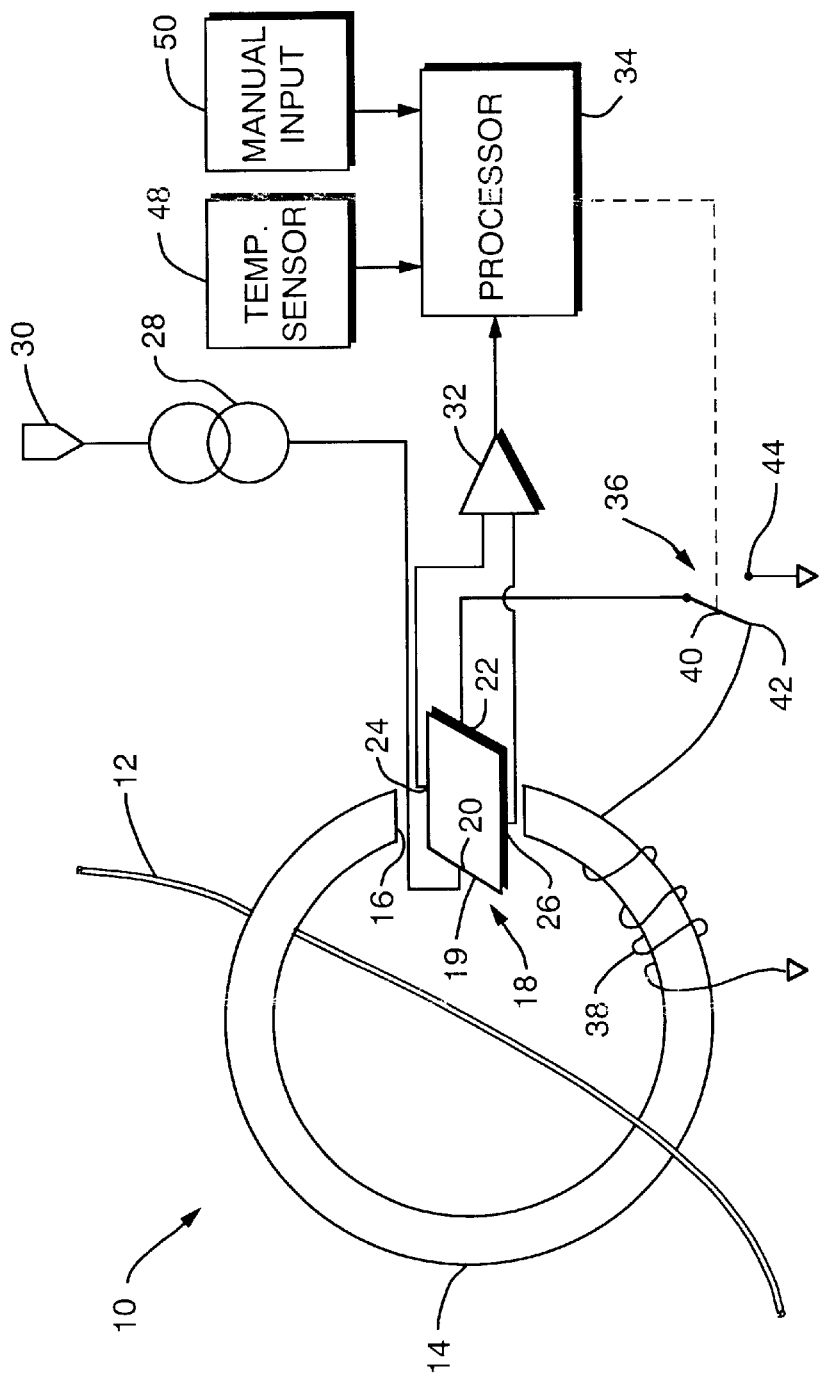
FIG. 2 is a schematic view of the current sensor of FIG. 1 set for auto-calibration.

Referring to the drawings wherein identical reference numerals denote the same elements throughout the various views, FIGS. 1 and 2 schematically show a current sensor 10 for sensing the current flowing through a conductor 12. The current sensor 10 includes a generally C-shaped core or flux concentrator 14 having a relatively small gap 16 formed therein and defining a central opening through which the conductor 12 passes. Although the conductor 12 is shown as having a single pass through the core 14, it could be configured as a having multiple turns on the core 14. The core 14 is preferably manufactured from a high permeability magnetic material such as ferrite or iron. Thus, a current flowing through the conductor 12 will generate a magnetic field in the core 14.

A Hall-effect device 18 is disposed in the gap 16. The Hall-effect device 18 comprises a base 19 that is made of a semiconductor material and is arranged in the gap 16 so as to be perpendicular to the magnetic field created by the core 14. The base 19 has first and second input terminals 20 and 22 and first and second output terminals 24 and 26. The first input terminal 20 is connected to a bias circuit 28, which is in turn connected to a supply 30 such as a constant voltage source. The bias circuit 28 is conventional circuitry that generates a bias current that flows through the base 19 from the first input terminal 20 to the second input terminal 22 to energize the Hall-effect device 18. When a magnetic field is applied to the Hall-effect device 18, a voltage is developed across the output terminals 24 and 26 that is proportional to the magnetic field. Specifically, the output voltage varies as a function of the strength of the magnetic flux density, and hence the magnetic field created by the conductor 12.

The output terminals 24 and 26 of the Hall-effect device 18 are connected to output circuitry in the form of a conventional amplifier circuit 32. The amplifier circuit 32 amplifies the output voltage of the Hall-effect device 18. The amplified output voltage is then supplied to a processor 34.

The current sensor 10 further includes an electronically controlled switch 36 and a calibration or auto-compensation coil 38 wound on the core 14 so as to change the magnetic flux density generated in the core 14 when energized. The switch 36 is a single pole, double throw switch having a pivoting pole 40 and first and second contacts 42 and 44. The pole 40 is connected to the second input terminal 22 of the Hall-effect device 18, and the second switch contact 44 is connected to ground. The calibration coil 38 is connected between the first switch contact 42 and ground and comprises a relatively small number of turns, preferably in the range of 50–100 turns. (By comparison, a typical current transformer has on the order of 1000 turns or more.) The small number of turns for the calibration coil 38 is selected so that the magnetic flux density generated in the core 14 will increase by approximately 5–15% when the calibration coil 38 is energized. The switching of the pole 40 is controlled by the processor 34, as will be described in more detail below.

For normal operation of the current sensor 10, the switch 36 is switched to its first position (FIG. 1) wherein the pole 40 engages the second switch contact 44. In this switch position, the bias current flows through the Hall-effect device 18 and to ground. Accordingly, the output voltage of the Hall-effect device 18 is a function only of magnetic flux density generated in the core 14 due to the current flowing through the conductor 12, i.e., the current to be sensed. Thus, the output voltage of the Hall-effect device 18 is representative of the current to be sensed. For auto-calibration, the switch 36 is switched to its second position (FIG. 2) wherein the pole 40 engages the first switch contact 42 so that the bias current flows through the Hall-effect device 18 and then through the calibration coil 38 and then to ground. In this switch position, the coil 38 is energized and the output voltage of the Hall-effect device 18 is a function of the magnetic flux density generated in the core 14 due to the current flowing through the conductor 12 and the bias current flowing through the calibration coil 38.

Figure 3:
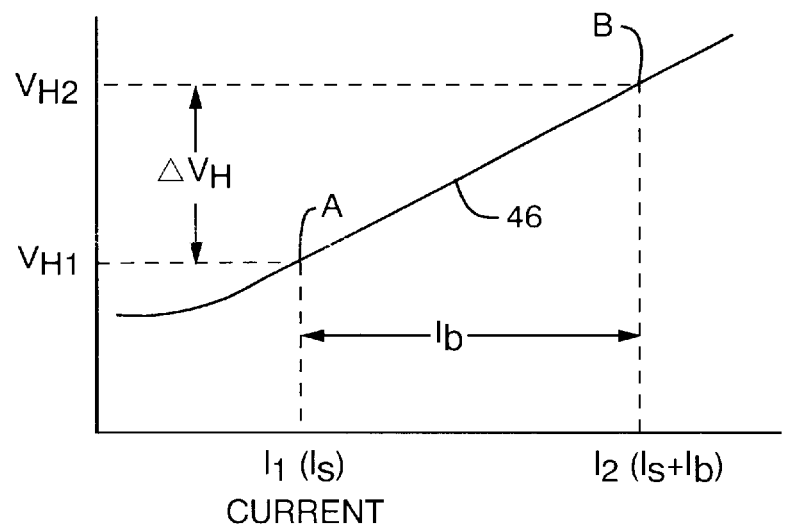
FIG. 3 is a graph plotting voltage against current in the calibration of a current sensor.

This is shown graphically in FIG. 3, which plots voltage against current. Specifically, $V_{H1}$ represents the output voltage of the Hall-effect device 18 inputted to the processor 34 when the switch 36 is in its first or normal operation position and $V_{H2}$ represents the output voltage of the Hall-effect device 18 inputted to the processor 34 when the switch 36 is in its second or auto-calibration position. For the purposes of performing a calibration, it is preferred that $V_{H1}$ be detected very close in time to when $V_{H2}$ is measured. This will avoid drift in the calibration process, and will enable the calibration process even when the current in the conductor 12 has a high bandwidth. As described above, $V_{H1}$ corresponds to the magnetic flux density generated in the core 14 due to only the current flowing through the conductor 12, and $V_{H2}$ corresponds to the magnetic flux density generated in the core 14 due to both the current flowing through the conductor 12 and the bias current flowing through the calibration coil 38. Thus, point A as shown in the graph of FIG. 3 corresponds to $V_{H1}$ and $I_1$, where $I_1$ is equal to the current flowing through the conductor 12 (i.e., the current to be sensed, $I_s$) and point B corresponds to $V_{H2}$ and $I_2$ where $I_2$ is equal to the current to be sensed plus the bias current ($I_s+I_b$). Points A and B define a curve 46, the slope of which is equal to the sensitivity of the current sensor 10. The curve 46 thus represents how the current is a function of the measured voltage. The processor 34 determines the sensitivity, S, using the following equation:

$$S = \frac{V_{H2} - V_{H1}}{(I_s + I_b) - I_s} = \frac{\Delta V_H}{I_b} \quad (1)$$

Thus, a value of the sensitivity is obtained from the known bias current and the measured change in the output voltage. This value is obtained in the presence of, and independently of, all external and internal interference and conditions such as the ambient temperature, the temperature of the core 14, any effects of the high permeability material used in the flux concentrator 14, and the like.

Once the sensitivity has been determined, the current sensor 10 is properly calibrated and normal operation thereof can resume. For normal operation, the switch 36 is switched to its first position (as shown in FIG. 1) wherein the pole 40 engages the second switch contact 44. In this switch position, the bias current flows through the Hall-effect device 18 and to ground. The resulting output voltage from the Hall-effect device 18 that is fed to the processor 34 represents the magnetic flux density generated in the core 14 due to the current flowing through the conductor 12. The processor 34 then uses the sensitivity S obtained in the most recent auto-calibration phase to determine the current $I_s$ flowing through the conductor 12 from the measured output voltage $V_H$ with the equation:

$$I_s = \frac{V_H}{S} \quad (2)$$

The processor 34 controls the switching of the switch 36 between its first and second positions. The processor 34 causes the switch 36 to be switched to its second position (as shown in FIG. 2) and thereby initiate a calibration in response to one or more of a variety of triggers. For instance, the processor 34 could be programmed to automatically initiate a calibration of the current sensor 10 on a periodic basis, such as once a minute or once a day. The period between calibrations would depend on factors such as the nature of the sensor 10, its application and its environment. The processor 34 could be programmed to initiate a calibration in response to a significant change in temperature of the current sensor 10. That is, if the temperature of the current sensor or the ambient temperature increased or decreased more than a predetermined amount, then the processor 34 would cause the switch 36 to be switched to its second position so as to obtain a calibration of the sensor 10. To this end, a temperature sensor 48 is provided for sensing the temperature of the current sensor 10 and producing a signal corresponding to the sensed temperature. The temperature signal is fed to the processor 34. The temperature sensor 48, shown schematically in FIGS. 1 and 2, could be a separate sensor located so as to sense the temperature of the current sensor 10. Alternatively, the temperature sensor 48 could be integrated on the base 19 of the Hall effect device 18. The processor 34 could also be provided with a manual input 50, such as a toggle switch, that a human operator could use to manually cause the processor to initiate a calibration. The processor 34 can be provided with all of these triggers or any subset thereof.

Alternatively, the current sensor 10 could be set up to operate such that the switch 36 is in its second position for normal operation and switched by the processor 34 to its first position for auto-calibration. In this mode, the bias current flows through both the Hall-effect device 18 and the calibration coil 38 and then to ground during normal operation, and the bias current flows through just the Hall-effect device 18 and then to ground during auto-calibration. Accordingly, the output voltage $V_{H1}$ of the Hall-effect device 18 during normal operation is a function of the magnetic flux density generated in the core 14 due to the current $I_s$ flowing through the conductor 12 and the bias current $I_b$ flowing through the calibration coil 38. The output voltage $V_{H2}$ of the Hall-effect device 18 during auto-calibration is a function only of magnetic flux density generated in the core 14 due to the current $I_s$ flowing through the conductor 12. The processor 34 is thus still able to determine the sensitivity from the measured output voltages and the known bias current $I_b$ using equation (1) above. Then, during normal operation, the processor 34 uses the sensitivity S obtained in the most recent auto-calibration phase to determine the current $I_s$ flowing through the conductor 12 from the current measured output voltage $V_H$ with the equation:

$$I_s = \frac{V_H}{S} - I_b \quad (3)$$

An advantage of using the second switch position shown in FIG. 2 during normal operation is that the addition of the bias current is more likely to place the measured output voltage in the linear region of the curve 46 shown in FIG. 3. This will make calibration and the current sensing function easier because the performance in the linear region is defined by a single parameter (i.e., the slope).

Although a Hall-effect device is described herein, it should be noted that the current sensor 10 can be implemented using any magnetic field sensitive device, such as magneto-resistors, giant magneto-resistors, MOSFET magnetic field sensors, magneto-transistors and the like. Either orthogonal magnetic field sensors (sensors sensitive only to magnetic fields perpendicular to their faces) or lateral magnetic field sensors (sensors sensitive only to magnetic fields parallel to their faces) can be used. When using a magnetic sensor, such as a giant magneto-resistor, that does not require a flux concentrator, the core 14 is not used. In this case, the calibration coil 38 could be formed on an air-core or any other arrangement that will cause the calibration coil 38 to create a magnetic field substantially in the same direction as the magnetic field to be sensed.

Figure 4:
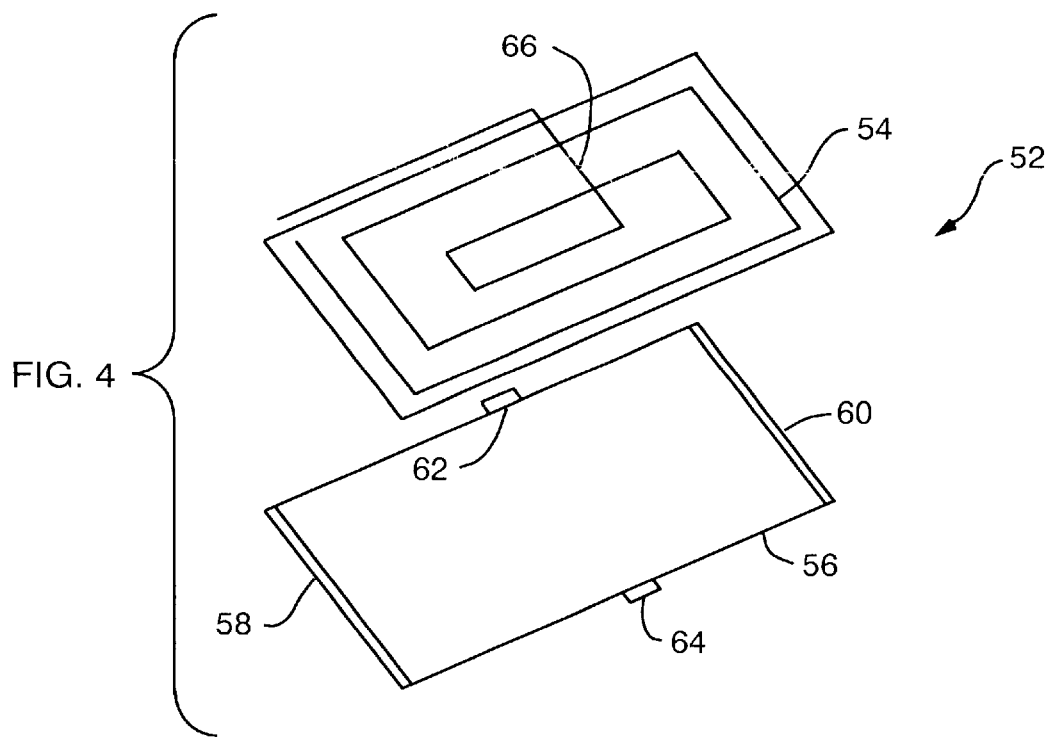
FIG. 4 is a schematic view of a second embodiment of a current sensor set for normal operation.
Figure 5:
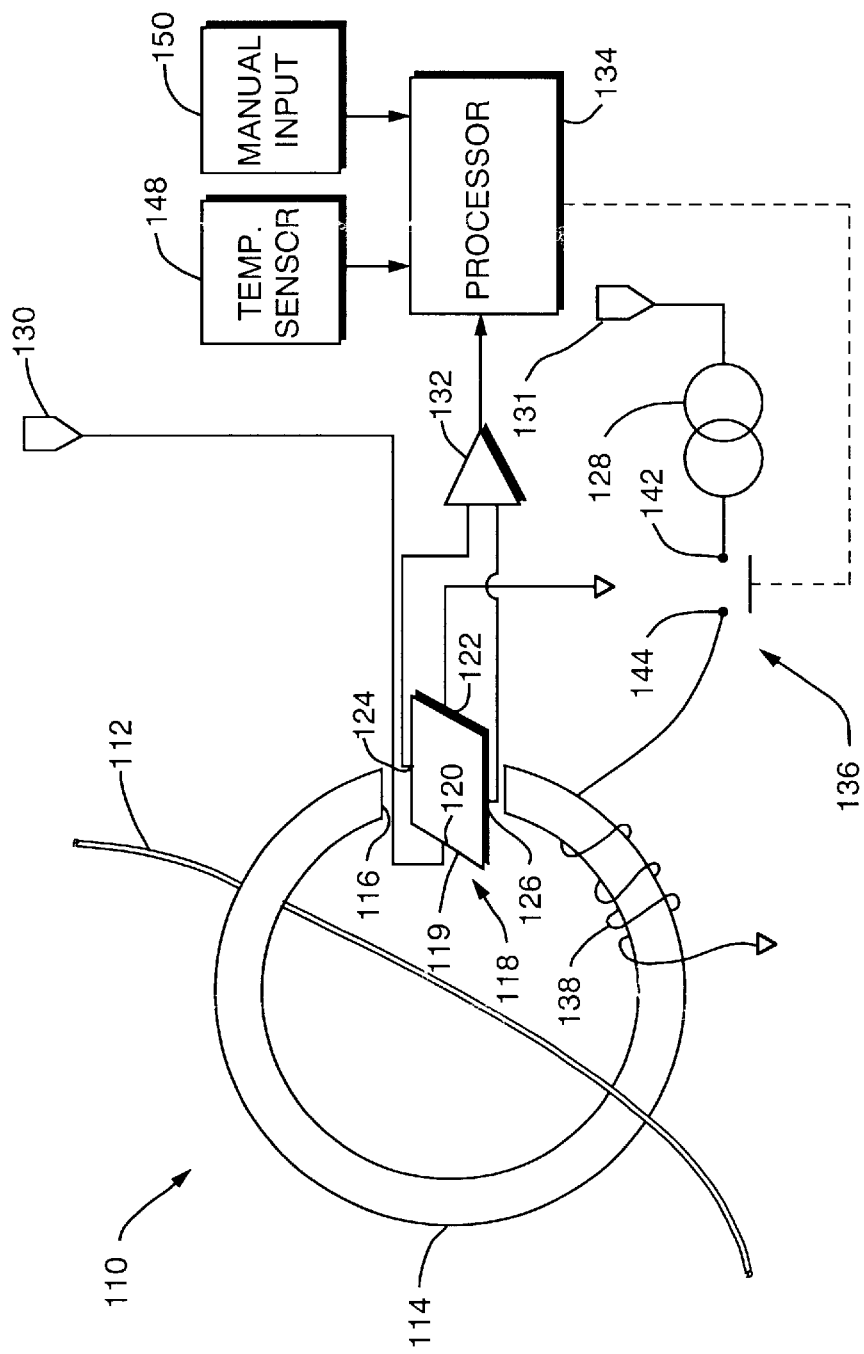
FIG. 5 is a schematic view of the current sensor of FIG. 4 set for auto-calibration.

The above-discussed embodiment is referred to herein as the "current mode" embodiment in that it operates with a constant current flowing through the Hall-effect device. FIGS. 4 and 5 schematically show a second embodiment that is referred to as the "voltage mode" embodiment in which a constant voltage is supplied to the Hall effect device. In the embodiment, a current sensor 110 for sensing the current flowing through a conductor 112 includes a generally C-shaped core or flux concentrator 114 having a relatively small gap 116 formed therein and defining a central opening through which the conductor 112 passes. Although the conductor 112 is shown as having a single pass through the core 114, it could be configured as a having multiple turns on the core 114. The core 114 is preferably manufactured from a high permeability magnetic material such as ferrite or iron. Thus, a current flowing through the conductor 112 will generate a magnetic field in the core 114.

A Hall-effect device 118 is disposed in the gap 116. The Hall-effect device 118 comprises a base 119 that is made of a semiconductor material and is arranged in the gap 116 so as to be perpendicular to the magnetic field created by the core 114. The base 119 has first and second input terminals 120 and 122 and first and second output terminals 124 and 126. The first input terminal 120 is connected to a supply 130 such as a constant voltage source, and the second input terminal 122 is connected to ground. Thus, a constant voltage is applied across the input terminals 120 and 122 such that a current flows through the base 119 of the Hall-effect device 118, thereby energizing the Hall-effect device 118. When a magnetic field is applied to the Hall-effect device 118, a voltage is developed across the output terminals 124 and 126 that is proportional to the magnetic field. Specifically, the output voltage varies as a function of the strength of the magnetic flux density, and hence the magnetic field created by the conductor 12.

The output terminals 124 and 126 of the Hall-effect device 118 are connected to output circuitry in the form of a conventional amplifier circuit 132. The amplifier circuit 132 amplifies the output voltage of the Hall-effect device 118. The amplified output voltage is then supplied to a processor 134.

The current sensor 110 further includes an electronically controlled switch 136 and a calibration or auto-compensation coil 138 wound on the core 114 so as to increase the magnetic flux density generated in the core 114 when energized. The switch 136 has a first switch contact 142 and a second switch contact 144. The first switch contact 142 is connected to a bias circuit 128, which is in turn connected to a second voltage supply 131. The calibration coil 138 is connected between the second switch contact 144 and ground. The bias circuit 128 is conventional circuitry that generates a bias current that flows through the calibration coil 138 when the switch 136 is closed. The calibration coil 138, like that of the first embodiment, comprises a relatively small number of turns, preferably in the range of 50–100 turns. Switching of the switch 136 is controlled by the processor 134 in the same manner as that described above in connection with the current mode embodiment.

For normal operation of the current sensor 110, the switch 136 is switched to its open position (FIG. 4). With the switch 136 open, current from the constant voltage source 130 flows through the Hall-effect device 118 and to ground, but no current flows through the calibration coil 138. Accordingly, the output voltage of the Hall-effect device 118 is a function only of magnetic flux density generated in the core 114 due to the current flowing through the conductor 112, i.e., the current to be sensed. Thus, the output voltage of the Hall-effect device 18 is representative of the current to be sensed. For auto-calibration, the switch 36 is switched to its closed position (FIG. 5) so that the bias current flows through the calibration coil 138. With the switch 136 closed, the coil 138 is energized and the output voltage of the Hall-effect device 118 is a function of the magnetic flux density generated in the core 114 due to the current flowing through the conductor 112 and the bias current flowing through the calibration coil 138.

As with the current mode embodiment, the output voltage $V_{H1}$ of the Hall-effect device 118 when the switch 136 is open and the output voltage of the Hall-effect device 118 $V_{H2}$ when the switch 136 is closed are both inputted to the processor 134. As before, $V_{H1}$ corresponds to the magnetic flux density generated in the core 114 due to only the current $I_s$ flowing through the conductor 112, and $V_{H2}$ corresponds to the magnetic flux density generated in the core 114 due to both the current $I_s$ flowing through the conductor 112 and the bias current $I_b$ flowing through the calibration coil 138. Thus, the processor 134 again determines the sensitivity S from the known bias current and the measured change in the output voltage according to equation (1) above.

Once the sensitivity has been determined, the current sensor 110 is properly calibrated and normal operation thereof can commence. For normal operation, the switch 36 is opened (as shown in FIG. 4). In this switch position, the resulting output voltage from the Hall-effect device 118 that is fed to the processor 134 represents the magnetic flux density generated in the core 114 due to the current flowing through the conductor 112. The processor 134 then uses the sensitivity obtained in the most recent auto-calibration phase to determine the current flowing through the conductor 112 from the measured output voltage from equation (2) above.

The processor 134 controls the switching of the switch 136 between its first and second positions. As is the first embodiment, the processor 134 can be programmed to automatically initiate a calibration of the current sensor 110 on a periodic basis, in response to a significant change in temperature of the current sensor 110 as detected by a temperature sensor 148, or in response to a manual input 150. The processor 134 can be provided with all of these triggers or any subset thereof.

As described above in connection with the first embodiment, the current sensor 110 could be set up to operate such that the switch 136 is in its second position for normal operation and switched by the processor 134 to its first position for auto-calibration. In this case, the processor 134 would still determine the sensitivity from the known bias current and the measured change in the output voltage according to equation (1) above, and then, during normal operation, the processor 134 would use the sensitivity obtained in the most recent auto-calibration phase to determine the current flowing through the conductor 112 from the measured output voltage $V_H$ with equation (3) above. The current sensor 110 could also be implemented without a flux-concentrating core.

Figure 6:
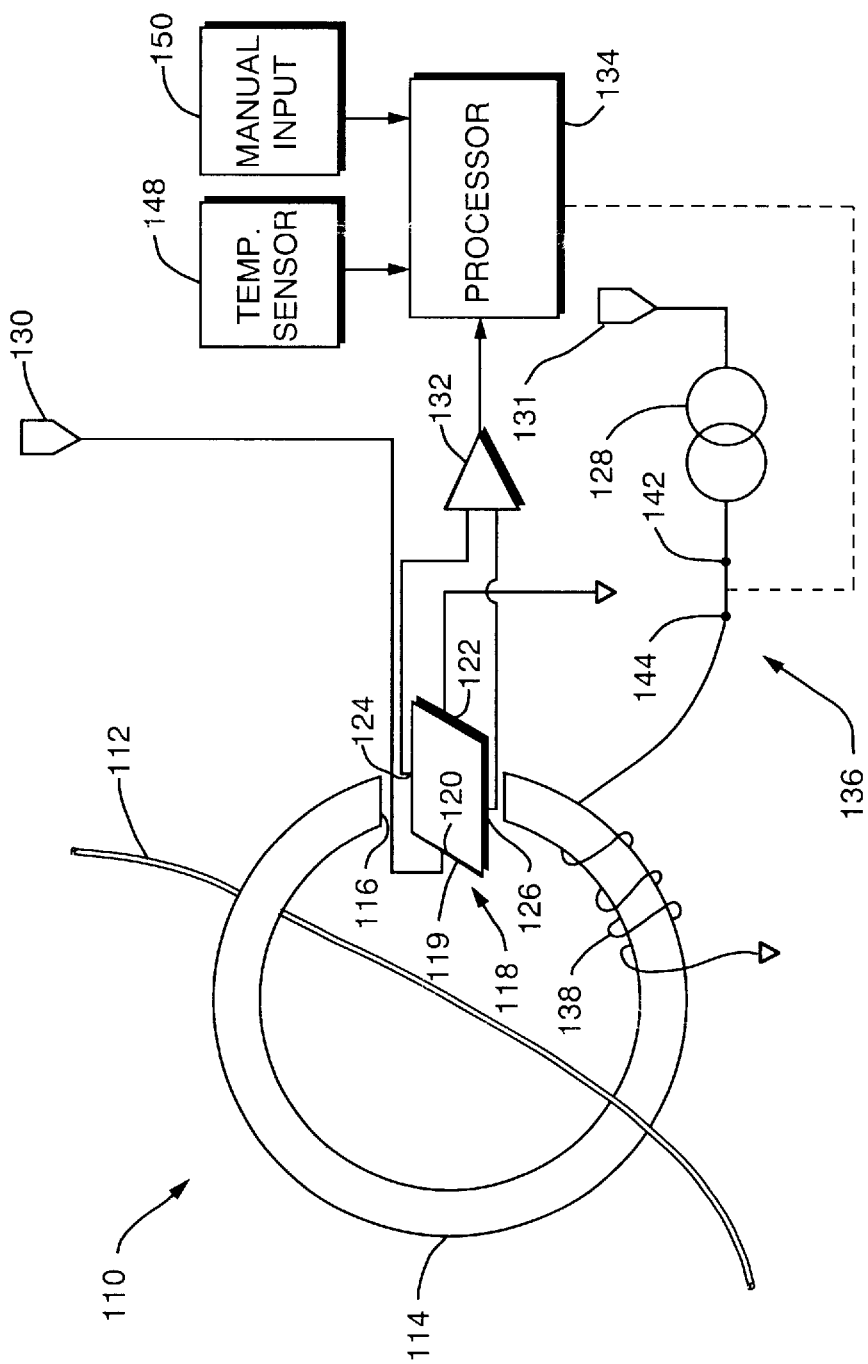
FIG. 6 is an exploded view of an integrated circuit that can be used in a current sensor.
Figure 7:
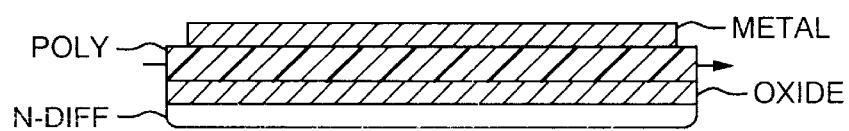
FIG. 7 is a sectional view of one embodiment of an integrated circuit that can be used in a current sensor.
Figure 8:
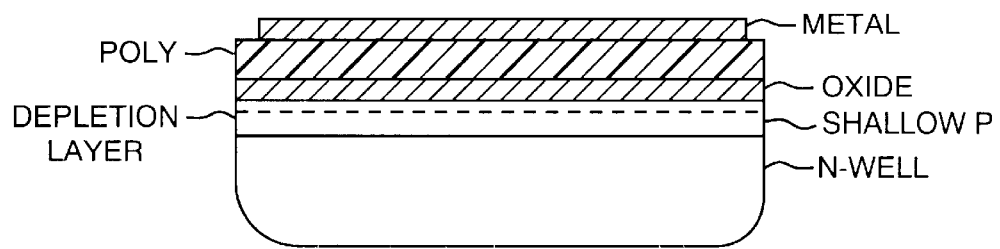
FIG. 8 is a sectional view of another embodiment of an integrated circuit that can be used in a current sensor.

The current mode and voltage mode embodiments as described above use discrete components. However, both embodiments can also be implemented using integrated circuit technology such as standard CMOS (complementary metal-oxide semiconductor) technology. Specifically, FIG. 6 shows an exploded view of an integrated circuit 52 in which a calibration or auto-compensation coil 54 and a Hall-effect device 56 are both fabricated on a single substrate. The Hall-effect device 56 includes first and second input terminals 58 and 60 and first and second output terminals 62 and 64. The Hall effect device can be fabricated using an N-diffusion for the current mode embodiment (as shown in FIG. 7) or an n-well for the voltage mode embodiment (as shown in FIG. 8). The calibration coil 54 is a planar coil formed in metals layers such as Metal1 and Metal2 in a standard CMOS process directly on top of the Hall-effect device 56. The coil 54 has a cross-over leg 66 that is formed so as to cross over the other loops of the coil 54 without contacting. In this implementation, the integrated circuit 52 could include on-chip electronics to obtain the bias currents, temperature sensing, switching, logic control, and signal amplification and processing described above.

To be implemented as part of an auto-calibrating current sensor, the integrated circuit 52 may be paired with a flux concentrator. For instance, the integrated circuit 52 could be arranged perpendicularly in a gap of a generally C-shaped core in the manner described above. Then, the integrated circuit 52 would be exposed to a magnetic flux density generated by the current flowing through a conductor passing through the flux concentrator. Alternatively, the integrated circuit 52 could be situated in close proximity to a conductor carrying the current to be sensed. The integrated circuit 52 would then be exposed to a magnetic flux density generated by the current flowing through this conductor. The operation for calibrating the sensor and sensing the current flowing through the conductor would be the same as that described above in connection the discrete component embodiments.

The current mode and voltage mode embodiments described above use a single supply 30, 131 for generating the bias current in the calibration coil 38, 138. In another alternative, both embodiments could be modified to utilize a plurality of different supplies arranged to alternatively generate the bias current. These supplies would be different so as to generate different bias currents, such as $I_b$, $2I_b$, and $3I_b$. Thus, by monitoring $V_{H1}$ and $V_{H2}$ for each bias current, a multi-point calibration can be obtained instead of the two-point calibration described above. This multi-point calibration would provide a generally finer calibration and could also be used to include a calculation of the offset voltage in the calibration scheme. In particular, the multi-point calibration is used to include a more general calibration such as non-linear calibration. Similarly, in yet another embodiment, a single supply can be used to generate a plurality of current values to be used; this is obtained by building an electronic switch in the design of the current source.

The foregoing has described an auto-calibrating magnetic field sensor. While specific embodiments of the present invention have been described, it will be apparent to those skilled in the art that various modifications thereto can be made without departing from the spirit and scope of the invention as defined in the appended claims.

What is claimed is:

1. A magnetic field sensor comprising:
    means for producing an output signal that is a function of a magnetic field to be sensed;
    a calibration coil arranged so as to change said magnetic field when energized;
    means for selectively energizing said calibration coil, and
    means for determining the sensitivity of said magnetic field sensor based on the difference of said output signal when said calibration coil is energized and said output signal when said calibration coil is not energized.

2. The magnetic field sensor of claim 1 further comprising a generally C-shaped core having a gap formed therein, said calibration coil being wound on said core.

3. The magnetic field sensor of claim 2 wherein said means for producing an output signal is a Hall-effect device disposed in said gap, said Hall-effect device having first and second input terminals and first and second output terminals.

4. The magnetic field sensor of claim 3 further comprising a bias circuit connected to said first input terminal.

5. The magnetic field sensor of claim 4 wherein said means for selectively energizing said calibration coil comprises a switch having a pole connected to said second output terminal and a first contact connected to said calibration coil, whereby when said pole engages said first contact, a current from said bias circuit flows through said calibration coil.

6. The magnetic field sensor of claim 3 wherein said first input terminal is connected to a voltage source and said second input terminal is connected to ground.

7. The magnetic field sensor of claim 6 further comprising a bias circuit connected to said calibration coil and wherein said means for selectively energizing said calibration coil comprises a switch having a first contact connected to said bias circuit and a second contact connected to said calibration coil, whereby when said switch is closed, a current from said bias circuit flows through said calibration coil.

8. The magnetic field sensor of claim 3 wherein said means for determining is a processor connected to said first and second output terminals.

9. The magnetic field sensor of claim 1 wherein said means for determining is a processor that controls said means for selectively energizing said calibration coil.

10. The magnetic field sensor of claim 9 wherein said processor controls said means for selectively energizing said calibration coil on a periodic basis.

11. The magnetic field sensor of claim 9 wherein said processor controls said means for selectively energizing said calibration coil in response to a temperature input.

12. The magnetic field sensor of claim 9 wherein said processor controls said means for selectively energizing said calibration coil in response to a manual input.

13. The magnetic field sensor of claim 1 wherein said means for producing an output signal and said calibration coil are implemented on an integrated circuit.

14. A magnetic field sensor comprising:
    a generally C-shaped core in which a magnetic field is generated, said C-shaped core having a gap formed therein;

means for producing an output signal that is a function of said magnetic field;

a calibration coil wound on said core so as to change said magnetic field when energized; and means for selectively energizing said calibration coil.

15. The magnetic field sensor of claim 14 wherein said means for producing an output signal is a Hall-effect device disposed in said gap, said Hall-effect device having first and second input terminals and first and second output terminals.

16. The magnetic field sensor of claim 15 further comprising a bias circuit connected to said first input terminal.

17. The magnetic field sensor of claim 16 wherein said means for selectively energizing said calibration coil comprises a switch having a pole connected to said second output terminal and a first contact connected to said calibration coil, whereby when said pole engages said first contact, a current from said bias circuit flows through said calibration coil.

18. The magnetic field sensor of claim 15 wherein said first input terminal is connected to a voltage source and said second input terminal is connected to ground.

19. The magnetic field sensor of claim 18 further comprising a bias circuit connected to said calibration coil and wherein said means for selectively energizing said calibration coil comprises a switch having a first contact connected to said bias circuit and a second contact connected to said calibration coil, whereby when said switch is closed, a current from said bias circuit flows through said calibration coil.

20. The magnetic field sensor of claim 15 further comprising a processor connected to said first and second output terminals.

21. The magnetic field sensor of claim 14 further comprising a processor for controlling said means for selectively energizing said calibration coil.

22. The magnetic field sensor of claim 21 wherein said processor controls said means for selectively energizing said calibration coil on a periodic basis.

23. The magnetic field sensor of claim 21 wherein said processor controls said means for selectively energizing said calibration coil in response to a temperature input.

24. The magnetic field sensor of claim 21 wherein said processor controls said means for selectively energizing said calibration coil in response to a manual input.

25. The magnetic field sensor of claim 14 wherein said means for producing an output signal and said calibration coil are implemented on an integrated circuit.

26. A method for calibrating a magnetic field sensor, said method comprising the steps of:

providing a calibration coil, said calibration coil arranged so as to change a magnetic field to be sensed;

causing a known current to flow through said calibration coil;

measuring the resultant change in said magnetic field; and calculating a sensitivity for said magnetic field sensor from said measured change in said magnetic field and said known current.

27. The method of claim 26 wherein said step of causing a known current to flow through said calibration coil is conducted on a periodic basis.

28. The method of claim 26 wherein said step of causing a known current to flow through said calibration coil is conducted in response to a temperature input.

29. The method of claim 26 wherein said step of causing a known current to flow through said calibration coil is conducted in response to a manual input.

* * * * *